United States Patent
Moore

(10) Patent No.: US 7,183,245 B2
(45) Date of Patent: Feb. 27, 2007

(54) STRIPPER FOR CURED NEGATIVE-TONE ISOPRENE-BASED PHOTORESIST AND BISBENZOCYCLOBUTENE COATINGS

(75) Inventor: John C. Moore, Camarillo, CA (US)

(73) Assignee: General Chemical Performance Products, LLC, Parsippany, NJ (US)

( * ) Notice: Subject to any disclaimer, the term of this patent is extended or adjusted under 35 U.S.C. 154(b) by 150 days.

(21) Appl. No.: 10/745,079

(22) Filed: Dec. 23, 2003

(65) Prior Publication Data

US 2005/0137103 A1   Jun. 23, 2005

(51) Int. Cl.
*C11D 17/00* (2006.01)
(52) U.S. Cl. ............................ 510/175; 510/407; 134/3
(58) Field of Classification Search ...................... None
See application file for complete search history.

(56) References Cited

U.S. PATENT DOCUMENTS

| | | | |
|---|---|---|---|
| 3,932,130 A | 1/1976 | Bennet et al. | |
| 4,165,294 A | 8/1979 | Mey | |
| 4,992,108 A | 2/1991 | Ward et al. | |
| 5,509,969 A * | 4/1996 | Grawe | 134/2 |
| 6,261,735 B1 | 7/2001 | Sahbari | |
| 6,475,292 B1 * | 11/2002 | Sahbari | 134/3 |
| 6,660,460 B2 * | 12/2003 | Sahbari | 430/331 |

* cited by examiner

*Primary Examiner*—Gregory Webb
(74) *Attorney, Agent, or Firm*—Arthur J. Plantamura

(57) ABSTRACT

A chemical stripping solvent composition is provided for removing cured polymeric isoprene and bisbenzocyclobutene (BCB) substances from an inorganic substrate. The stripping composition comprises about 20 to about 30 weight percent anisole, about 20 to about 30 weight percent mesitylene, about 35 to about 55 weight percent of an alkylbenzene sulfonic acid, and may contain methane sulfonic acid (MSA) at 3 to about 10 weight percent, added to remove BCB in the full-cured state. Also provided is a method for stripping cured polymeric organic substances by contacting the polymeric organic substance with the stripping solvent composition at a given temperature and for a period of time sufficient to essentially dissolve and remove cured polymeric substances.

10 Claims, No Drawings

STRIPPER FOR CURED NEGATIVE-TONE ISOPRENE-BASED PHOTORESIST AND BISBENZOCYCLOBUTENE COATINGS

This invention relates to chemical strippers for removing full-cured negative-tone isoprene-based photoresist and bisbenzocyclobutene (BCB) coatings. For isoprene resist stripping, the invention will perform at a relatively low temperature and exhibit a higher removal rate as compared to known industry standards. Prior to this invention, no other safe stripper was known as being effective to remove full-cure BCB surface layers or coatings. When used in conjunction with metals at given exposure times, the chemistry is found to be safe with even the softest of metals, such as aluminum. The stripper of the invention is non-toxic, easily rinsed with water, and when processing isoprene resists at low temperature, the used chemistry may be sent directly to a common flammable organic waste stream collection system that may be typical to most semiconductor fabrication areas. The invention has been found to be a substantial benefit in the area of semiconductor wafer processing.

BACKGROUND OF THE INVENTION

Isoprene polymer, in the presence of certain cross-linking photoinitiators, will cure to a smooth rubber and highly chemically resistant framework. This cured polymeric material is used to produce patterns (masks) which become the basis for depositing microcircuits in semiconductor manufacturing. At the completion of the process, the mask is removed utilizing the novel stripping composition of the invention. Upon contact with the stripper, the cured polymeric mask will chemically breakdown, and in turn, may be readily rinsed away.

During the manufacture of semiconductor microcircuits, various inorganic substrates such as single and polycrystalline silicon, hybrid semiconductors such as gallium arsenide, and metals, are coated with a polymeric organic substance which forms a resist mask after undergoing a photolithographic process. The polymeric resist mask is used to protect selected areas of the substrate surface, e.g. silicon, silicon dioxide, or aluminum, etc., from the action of chemicals in both wet (solution) and dry (plasma) forms. The exposed areas of the substrate may carry out a desired etch (removal) or deposition (addition) process. Following completion of this operation and after subsequent rinsing or conditioning, it is necessary that the resist mask and any application post-etch residue be removed to permit essential finishing operations. Upon removal of the mask, specific micro-etched or deposited patterns are left behind. The masking and patterning processes are repeated several times to produce layered microcircuits that comprise the final semiconductor device. Each step requires complete resist stripping and cleaning, to ensure that the final form device is produced at good yields and performs satisfactorily.

To fully appreciate the challenges in removing such materials, it is important to understand the nature of the organic coatings and how they are used in semiconductor manufacturing processes. Organic masking agents comprise many sorts of photoresists. One of the more tenacious polymers is a negative-tone variety that is hydrophobic (non-polar), described as a biazide/cyclized isoprene (rubber) system. Cyclized isoprene is preferred over conventional natural rubber and other polymerized isoprenes due to its more rigid character and reduced solubility. The isoprene polymer is linear, a product of straight-chain Ziegler-Natta polymerization, making it a good candidate for between-chain crosslinking. The isoprene photoresist will react to light and initiate a photochemical reaction. Upon exposure to ultraviolet light of a specific frequency, the azide undergoes free-radical generation and crosslinks between the isoprene chains. The result is a rigid polymer network that incorporates the azide crosslinker between the chains.

The exposed system is less soluble than the unexposed material. The unexposed material is dissolved and rinsed away (developed) from the exposed, leaving behind a negative image as compared to the pattern in which light had traveled. When viewing the remaining pattern under a high resolution microscope (i.e. scanning electron microscopy, SEM), the resultant sidewall of the resist is commonly not vertical (i.e. 90°) from top to bottom. In fact, the pattern wall has a negative slope (i.e.<90°), as measured from the bottom plane of the developed area. This results during imaging when a reduced efficiency of the photochemical reaction (crosslinking) is exhibited as light proceeds downward through the resist, causing less and less of the resist to be imaged and cured. At the pattern edge, the resist near the top surface may be fully cured, yet curing of the material near the bottom is reduced. As a result, the material at the top of the profile has a reduced solubility, whereas that near the bottom is more soluble. During the development process, more of the soluble material near the bottom (substrate) is removed. The resulting pattern is viewed to be larger at the top than at the bottom, giving the effect of a "negative" slope.

This negative slope is needed for depositing thick metal lines in a process commonly referred to as deposition and "lift-off." Following the patterning process, metal is coated onto the pattern either by plasma deposition or wet chemical plating. After deposition, the resist is stripped from the surface bringing with it the unwanted metal that was originally deposited directly onto the resist pattern. This occurs by a solvent stripping process whereby solvent molecules penetrate exposed resist from the side at the negative slope profile. As the solvent penetrates, the resist begins to swell and dissolve, causing the unwanted metal to "lift-off." Once the metal and resist enters the bulk chemical, it can then be filtered and reused repeatedly. After the resist is stripped and metal is lifted off and rinsed away, what is left behind are the metal lines that were originally deposited within the resist pattern.

Reliability issues may arise in a lift-off process, or for that matter, any resist strip process, due to the variability in exposure conditions. If this variability is due to factors that affect the curing process, it will result in a change of the chemical make-up of the resist. The factors that control a curing process include light, temperature, and oxygen. For purposes of this description, the focus will be limited to temperature, one of the most common variables in a manufacturing process. Temperature changes may be due to variability in substrate conductivity or thermostat controls when using a hotplate or an oven. An organic material exposed to different temperatures may exhibit varying densities in its bulk form and show changes in surface composition. This is observed in oven-cured polymers where a material coating is heated by convection.

It is generally observed that polymers exposed to convection heat will cure to a higher extent due to the formation of a surface "skin." The surface skin results from direct contact with heat in the environment (i.e. convection heat), causing accelerated curing to form a higher bulk density polymer at the surface (i.e. skin). This polymer skin will commonly solvate much slower than a material that is cured internally or at lower temperatures. Accordingly, temperature variation is a common process variable, which may produce coatings, which exhibit a range of solubility characteristics. Strippers that are designed to solvate polymers exposed to temperature extremes will be robust for general cleaning processes. This invention describes a robust chemical stripper designed to dissolve and remove fully cured negative-tone isoprene photoresists.

Another chemically resistant polymer used for semiconductor manufacturing is based upon the resin, bisbenzocyclobutene (BCB). This resin is used as a planarizing dielectric for packaging and protecting final form semiconductor wafers. As it is known in the industry, BCB is manufactured by DOW Chemical Company under the tradename, Cyclotene®. Like most resists, it is spin-coated onto a wafer and heat cured. To reach acceptable curing conditions, BCB is oven heated in an inert atmosphere to temperatures reaching the order of 350° C. Applications of the BCB polymer include the protection of multilayer interconnects on GaAs (Gallium Arsenic) devices, a supporting structure for wafer bumping and packaging, and as a dielectric for circuit boards.

Occasionally, BCB polymer must be reworked (removed) by a chemical stripping process. Although it is disclosed that fuming nitric acid may strip the cured BCB material, mineral acids are deemed too aggressive to metals and are considered unacceptable for reworking final form devices, wafers, and boards. Although uncured BCB may be removed by heated organic solvents, the full-cure version has been regarded as being completely impervious to similar chemistries. By a heated chemical operation that is similar in scope to a common photoresist stripping process, the system of the invention is effective in dissolving and removing the fully cured BCB polymer. The invention is observed to be safe for metals as measured during given exposure times.

The common method used in removing cured negative-tone isoprene resist masks or BCB polymer from the substrate is by direct contact with an organic stripper. The chemistry of the stripper penetrates the polymer surface and causes it to swell, whereby the presence of an organic acid undergoes a reaction to hydrolyze and sever the cross-linked portions. As this process continues, more and more of the polymer is exposed until the products of hydrolyzation and dissolution are broken down into relatively small chains that can be filtered and removed from the chemistry.

The known prior art stripping compositions have usually been less than satisfactory or have the distinct disadvantage of presenting unacceptable toxicity and/or pollution problems from the disposal of such compounds as phenol, cresol, and chlorinated hydrocarbons. Other known prior art for removing polymeric organic substances that include inorganic compounds are not suitable such as, aqueous sulfuric acid compositions containing a significant amount of fluoride ion to reduce metallic dulling and corrosion, as exemplified in U.S. Pat. No. 3,932,130. Some photoresist strippers require the presence of fluoride ion stabilizers to prevent metallic corrosion and operate at elevated temperatures. Although these strippers may provide value to industrial applications, they are deemed to be too aggressive for semiconductor devices.

The efficiency and selectivity of a stripper is also desirable. There is a need, accordingly, for improved stripping compositions, which will remove the polymeric organic substance from the coated inorganic substrate without corroding, dissolving or dulling the surface of the metallic circuitry, or chemically altering the inorganic substrate.

This invention aids in semiconductor manufacturing by stripping full-cure (i.e. 200C exposure) negative-tone isoprene photoresists at processing temperatures equal to or below 70° C. within a time period of 15 minutes. The invention offers a benefit over prior art, as disclosed in U.S. Pat. Nos. 4,165,294, 4,992,108, and 6,261,735, where the removal of similar isoprene resist coatings required elevated processing temperatures of>100° C.,>80° C., and>85° C., respectively. Further, the isoprene samples used in this prior art were cured to lower temperatures (i.e. 150C max). The present invention thus affords a substantial advance that benefits industry.

Additionally, the invention fulfills a need for a safe chemical stripper for BCB coatings, which have experienced a range of cure conditions through complete polymerization (i.e. full cure). When the invention is compared to the systems of U.S. Pat. No. 4,165,294, 4,992,108, and 6,261,735, the chemistries described were found to have no observed effect on full-cure BCB coatings. Whereas, this invention was found to remove full-cure BCB coatings within 45 min of exposure at processing temperatures near 110C. Accordingly, the invention provides an improved means to dissolve and remove both full-cure negative-tone isoprene resist and BCB coatings, which have been cured from a limited level to full-cure. By adjustment of the type of sulfonic acid present, removal selectivity between cured isoprene and BCB may be achieved.

It is, accordingly, the objective of this invention to provide a material and process which is employed to thoroughly and selectively penetrate and dissolve fully-cured isoprene negative-tone resists and BCB coatings.

The invention in essence provides an organic stripping composition and system for dissolving cured negative-tone isoprene-based photoresist and BCB coatings. The system of this invention operates effectively without the introduction of toxic substances, operates at moderate temperatures, and is deemed safe to adjacent metals. By adjustment of the type of sulfonic acid present, removal selectivity between the isoprene and full-cure BCB may be achieved. The utility of the invention is particularly advantageous for semiconductor fabrication lines where rapid processing at low temperatures and using a simple alcohol or water rinse is effective for producing clean substrates.

SUMMARY OF THE INVENTION

In accordance with this invention, a stripping composition for removing polymeric organic substances from an inorganic substrate is provided. The stripping composition comprises a blend of chemistries deemed effective to remove fully-cured negative-tone isoprene-based photoresist at moderate processing conditions. When a relatively minor adjustment is made in the type of sulfonic acid present, it is found that full-cure bisbenzocyclobutene (BCB) coatings may be removed, and this adjustment does not adversely affecting the removal performance on isoprene resists.

Isoprene polymer in the presence of certain cross-linking photoinitiators will cure to a smooth rubber and highly chemically resistant framework that is used to produce patterns which become the basis for depositing microcircuits in semiconductor manufacturing. At the completion of the process, the original mask is removed by employing the stripping composition of the invention. Upon being treated with the stripper of the invention, the cured polymer breaks down, whereby the residue may be rinsed away. It is apparent that the removal rate will vary depending upon the thickness of the resist and the extent of cure, which the polymer is taken. Although polymer removal is known to be dependent upon heat and processing time, agitation is also a benefit.

BCB coatings will dissolve and be rendered removable by the invention. The conditions necessary to remove a BCB coating will depend upon the extent of curing. For simple soft cure BCB, processing conditions can be as low as 30 seconds at room temperature. As curing increases, higher temperatures and longer times are needed for removal. At full cure, effective removal of the BCB is done with the invention in which part of the stripper's sulfonic acid includes methane sulfonic acid (MSA). Full-cure BCB is removed by the MSA-aided stripper of the invention in about 45 minutes at temperatures of the order of about 110° C. The present invention is regarded as providing the only known effective means, utilizing an organic stripper, to chemically remove fully cured BCB coatings in a manner that is safe for the underlying metal device.

DETAILED DESCRIPTION OF THE INVENTION

The present invention provides a novel stripping composition, which quickly and effectively removes polymeric organic substances from inorganic substrates, from metallic, non-metallic and metallized non-metallic substrates and includes methods of using the composition. The stripping composition of the invention (composition #1 below) comprises an alkyl benzene sulfonic acid and petroleum solvents of suitable formulations that include compositions within the following weight proportions:

| Composition #1 | |
| --- | --- |
| A) Dodecylbenzene sulfonic acid | 35–55 wt % |
| B) Anisole | 20–30 wt % |
| C) Mesitylene | 20–30 wt % |

The preferred alkyl benzene sulfonic acid is dodecylbenzene sulfonic acid (DDBSA). The preferred petroleum solvents are anisole (methoxybenzene, methyl phenate) and mesitylene (1,3,5-trimethylbenzene).

The invention dissolves and removes isoprene resists and BCB coatings at various cure levels. For full-cure BCB coatings, the invention preferably requires an additional sulfonic acid, methane sulfonic acid (MSA). Therefore, for removing both full-cure isoprene photoresists and BCB, it is recommended that the invention contain MSA. The stripping composition of this variation comprises a blend of alkyl-sulfonic acids and petroleum solvents of suitable formulations that include compositions within the following weight proportions:

| Composition #2 | |
| --- | --- |
| A) Dodecylbenzene sulfonic acid | 35–55 wt % |
| B) Anisole | 20–30 wt % |
| C) Mesitylene | 20–30 wt % |
| D) Methane sulfonic acid | 3–10 wt % |

In essence, the novel coating dissolving system of the invention comprises a specialty blend of non-toxic chemistries designed to remove isoprene-based negative-tone photoresists and full-cure BCB coatings. The stripping composition contains specialty organic acids blended with a solvent system that is selected to exhibit high performance and stability. Although isoprene-based resists are known to require the stripper be taken to high temperatures for relatively long periods of time, the solvent system of the invention is effective in dissolving and removing the resists relatively expeditiously at moderate temperatures.

For example, cured isoprene resists exposed to extreme conditions (i.e. near 200° C.), may be dissolved in a period of 5–15 minutes at a moderate temperature, e.g., below 95° C. and preferably below 70° C., and exhibits a relatively high product bath-life compared to other products designed for similar low-temperature applications. The active ingredients provide excellent dissolution and offer surfactancy such that the solvent system of the invention may be easily rinsed with alcohol or emulsified in DI water. Metals such as aluminum are observed to be safe based upon exposure tests taken to a factor of up to 10 times the normal processing time.

Various cyclized isoprene resists have been evaluated, all at given recommended manufacturer's processing conditions. Additionally, the composition of the invention was used on a worst case isoprene specimen. The chosen specimen SC Resist 900 (SC-900) manufactured by Arch Chemicals, Inc., described as a high viscosity photoresist (i.e. high molecular weight, MW), was selected as a worst case representative of the family of negative-tone cyclized isoprenes. Prior observations dictate that when a process is designed for worst case conditions, a large buffer of safety is established. Namely, when the design is built around the removal of products of high densities (i.e. high MW) or high cure levels, the process will be robust for removing lower MW versions of the same family of products or of a low cure state.

This worst case design plan applies in choosing the SC-900 isoprene photoresist as disclosed in U.S. Pat. No. 6,261,735, wherein a long list of similar isoprenes of the same series (i.e. SC-series) varying from SC-100 to SC-450 are disclosed. It is to be noted that progressively higher temperatures with longer times are required to remove higher MW polymers disclosed in U.S. Pat. No. 6,261,735 to meet the criteria of being completely clean. For example, the stripping formulations disclosed in that patent describe the cleaning of SC-100, SC-180, and SC-450 (e.g. increasing MW isoprenes), in 4–5 min (85C), 12–15 min (90C), and 30–35 min (90C), respectively. Further all of the isoprene coatings noted in that patent have been cured to a temperature of 150° C. Thus, it follows from the disclosure of U.S. Pat. No. 6,261,735 that a product from the same series that is higher on the product scale (i.e. SC-900) should require removal (stripping) conditions that comprise a higher temperature and a longer time of exposure in order to achieve complete cleansing.

The data in Table 1 describes various isoprene and BCB coatings prepared to demonstrate the stripping compositions of the present invention. The post application bake (PAB) and post exposure bake (PEB) being carried out in an oven with the BCB under inert conditions.

TABLE I

| Specimen | Material | Thickness | Substrate | PAB | Exposure | PEB | Results |
|---|---|---|---|---|---|---|---|
| 1 | SC-900, Isoprene | 10 um | Silicon | 90 C., 30 min | 2 W, 30 min | 135 C. 30 min | Full-cure |
| 2 | SC-900, Isoprene | 10 um | Silicon | 90 C., 30 min | 2 W, 30 min | 150 C. 30 min | Full-cure |
| 3 | SC-900, Isoprene | 10 um | Silicon | 90 C., 30 min | 2 W, 30 min | 200 C. 30 min | Full-cure |
| 4 | SC-900, Isoprene | 10 um | Aluminum | 90 C., 30 min | 2 W, 30 min | 200 C. 30 min | Full-cure |
| 5 | BCB, ≦50% cure | 5 um | Silicon | 90 C., 30 min | N/A | <200 C. 30 min | Non-cure |
| 6 | BCB, ≦80% cure | 5 um | Silicon | 90 C., 30 min | N/A | 210 C. 30 min | Soft-cure |
| 7 | BCB, ≧90% cure | 5 um | Silicon | 90 C., 30 min | N/A | ≧230 C. 30 min | Full-cure |

The specimens from Table 1 were tested for stripping effectiveness (removal) using compositions #1 and #2 of the invention as well as other competing products currently available on the market. The results from these competing products have been omitted due to their formulations containing chemical constituents deemed toxic or unacceptable for semiconductor manufacturing or having a performance that was found to be outside the time frame of the experiments. In the case of the full-cure BCB coating (Table 1, specimen 7), only composition #2 of the subject invention was found to be acceptable, the others tested were observed to exhibit no effect. The results of this experiment are shown in Table 2.

TABLE 2

| Specimen | Invention Process Conditions | Composition #1 | Composition #2 |
|---|---|---|---|
| 1 | <5 min, 70 C. | Completely clean | Completely clean |
| 2 | <5 min, 70 C. | Completely clean | Completely clean |
| 3 | 5 min, 70 C. | Completely clean | Completely clean |
| 4 | 5–15 min, 70 C. | Completely clean | Completely clean |
| 5 | 0.5–3 min, 25 C. | Completely clean | Completely clean |
| 6 | <10 min, 70 C. | Completely clean | Completely clean |
| 7 | ≦45 min, 90–110 C. | No clean | Completely clean |

A cured cyclized isoprene was shown to be fully dissolved by use of the stripper compositions of both #1 and #2 of the invention. The product does not "flake" or "lift off" the substrate. Rather, the resist coating is observed to dissolve, mix in the stripping composition, and rinse away from the substrate surface. In most cases, dissolution and removal is complete in 5 min.

The stripper of the invention is stable at a variety of temperatures. It will maintain a homogenous mix at temperatures varying from 5–120° C. When used at temperatures above 100° C., the stripper begins to darken slightly, a common phenomenon for organic materials.

It is observed in the application of the dissolving (stripper) system of the invention that cured isoprenes which are taken to excessive temperatures of ≧150° C. or may-be cured onto non-conventional substrates (i.e. aluminum or polymide, specimen #4 of Tables 1 & 2), some of the "rubber" character of the isoprene may be lost yielding a more dense material. The product, accordingly, would likely require more aggressive chemistries to penetrate the matrix and cause dissolution. Nevertheless, the stripper of the invention performed well in dissolving and removing such dense specimens.

The stripper of the invention is hydrophobic which maximizes dissolution of the isoprene, while minimizing effects on any hydrophilic materials present. Most noteworthy with such a hydrophobe (i.e. hydrocarbon solvents) is it's reduced solution conductivity. Galvanic corrosion (i.e. metal attack) is directly dependent upon solution conductivity. When considering galvanic corrosion in solutions of hydrocarbons similar to this invention, the solution is expected to have a reduced prevalence of corrosion as compared to hydrophilic solvents that conduct at a greater rate.

Galvanic corrosion testing was conducted with representative metals that may be used in electronic devices. Alloys of titanium-tungsten (TiW) and aluminum (Al) were tested in conjunction with each other in an immersion condition with the invention at normal processing temperatures for isoprene resist stripping. The test was carried out over 2 hours, a time frame of >10 times the normal processing time (i.e. 5–10 minutes) when considering two baths of the invention in series in a counter-current recycling arrangement. The metals were evaluated with two common tools used in a semiconductor fabrication area, a profilometer (i.e. thickness measurement with stylus contact) and a scanning electron microscope (SEM). A trained scientist is used to make a determination and provide an opinion, where necessary, for each condition. The results are given in Table 3.

TABLE 3

| Metal | Profilometry (delta) | SEM (observation) | Remarks |
|---|---|---|---|
| TiW | <300 Å* = 2.5 Å/min | No change | No effect (no etch) |
| Al | <200 Å* = 1.7 Å/min | No change | No effect (no etch) |

*Note: these values (i.e. 200–300 Å) represent the overall sample roughness measurement as determined by examination of the center and edge locations.

Results of galvanic corrosion testing in the given invention compositions indicate that the measured value by profilometry may be at the baseline for the samples tested (i.e. roughness). Further, if the values are acceptable, the etch rates of 1.7–2.5 Å/min are well within the acceptability limits of this technology for process times that approximate 5–10 minutes.

Although the invention has been described in terms of specific tests and embodiments, it will be apparent that one skilled in the art can substitute other known variants, tests and embodiments without departing from the essence of the invention. Accordingly, the invention is only to be limited by the scope of the appended claims.

What is claimed:

1. A liquid solvating composition for removing cured isoprene photoresist and BCB surface layers from an inorganic substrate comprising a blend of
   from about 35 to about 55 weight percent of an alkylbenzene sulfonic acid,
   about 20 to about 30 weight percent anisole, and
   about 20 to about 30 weight percent mesitylene.

2. A liquid solvating composition of claim 1, which includes also about 10 weight percent methane sulfonic acid.

3. The composition of claim 1 wherein the alkylbenzene sulfonic acid is dodecylbenzene sulfonic acid.

4. The composition of claim 2 wherein the alkylbenzene sulfonic acid is dodecylbenzene sulfonic acid.

5. In a method for removing cured polymeric layers from an inorganic substrate the improvement characterized in the material to be removed is contacted with the stripping solvent of claim 1 at a temperature which may be as low as room temperature for a period of time sufficient to remove said substance.

6. In a method for removing full-cure isoprene negative photoresists from an inorganic substrate the improvement is characterized in that the isoprene resist to be removed is contacted with the stripping solvent of claim 1 at a temperature not in excess of about 700° C. for a period of time sufficient to remove said substance.

7. In a method for removing full-cure isoprene negative photoresists from an inorganic substrate the improvement is characterized in that the isoprene resist to be removed is contacted with the stripping solvent of claim 2 at a temperature not in excess of about 70° C. for a period of time sufficient to remove said substance.

8. In a method for removing bisbenzocyclobutene (BCB), which has been cured to less than full-cure, from an inorganic substrate, the improvement is characterized in that the BCB to be removed is contacted with the stripping solvent of claim 1 at a temperature not exceeding about 110° C. for a period of time sufficient to remove said substance.

9. In a method for removing bisbenzocyclobutene (BCB), which has been cured to complete full-cure, from an inorganic substrate, the improvement is characterized in that the BCB to be removed is contacted with the stripping solvent of claim 2 at a temperature at 110° C. for a period of time near 45 minutes.

10. In a method for removing polymeric coatings from inorganic substrates which contain metallized areas, the improvement characterized by effecting the removal with the composition of claim 1 such that limited or no galvanic corrosion to dissimilar metals such as titanium-tungsten and soft metals such as aluminum to have an etch rate at $\leqq 2.5$ Å/mm. is exhibited.

* * * * *